(12) United States Patent
Liu et al.

(10) Patent No.: US 10,865,473 B2
(45) Date of Patent: Dec. 15, 2020

(54) MASK PLATE AND PROCESS FOR MANUFACTURING THE SAME

(71) Applicant: BOE TECHNOLOGY GROUP CO., LTD., Beijing (CN)

(72) Inventors: Wenqi Liu, Beijing (CN); Zhongyuan Sun, Beijing (CN); Haibin Zhu, Beijing (CN); Jinxiang Xue, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/019,813

(22) Filed: Jun. 27, 2018

(65) Prior Publication Data

US 2019/0203349 A1 Jul. 4, 2019

(30) Foreign Application Priority Data

Jan. 3, 2018 (CN) .......................... 2018 1 0004139

(51) Int. Cl.
*C23C 16/04* (2006.01)
*C23C 14/04* (2006.01)
(Continued)

(52) U.S. Cl.
CPC .......... *C23C 16/042* (2013.01); *B05C 21/005* (2013.01); *C23C 14/042* (2013.01);
(Continued)

(58) Field of Classification Search
None
See application file for complete search history.

(56) References Cited

U.S. PATENT DOCUMENTS 6,878,209 B2 * 4/2005 Himeshima ......... H01L 27/3283
118/504
8,646,405 B2 * 2/2014 An ......................... C23C 14/042
118/504

(Continued)

FOREIGN PATENT DOCUMENTS

CN 201600550 U 10/2010
CN 103236398 A 8/2013

(Continued)

OTHER PUBLICATIONS

1st Chinese Office Action, English Translation.

(Continued)

*Primary Examiner* — Jethro M. Pence
(74) *Attorney, Agent, or Firm* — Brooks Kushman P.C.

(57) ABSTRACT

The present disclosure provides a mask plate and a method for manufacturing the same. The mask plate comprises a body provided with a plurality of openings, in which a first surface of the body is provided with cofferdams each surrounding a corresponding opening, and each cofferdam is configured to confine a diffusion range of a material deposited on a substrate through the opening. In the present disclosure, by providing, on a surface of the body of the mask plate, cofferdams each surrounding edges of each corresponding opening, the cofferdams can effectively prevent the deposition material from depositing into an invalid region, thus CVD shadow can be reduced and the packaging effect can be improved in the process of film deposition or evaporation by chemical vapor deposition (CVD).

18 Claims, 5 Drawing Sheets

(51) Int. Cl.
  *H01L 51/00*   (2006.01)
  *H01L 51/52*   (2006.01)
  *H01L 51/56*   (2006.01)
  *B05C 21/00*   (2006.01)

(52) U.S. Cl.
  CPC .......... *H01L 51/5253* (2013.01); *H01L 51/56* (2013.01); *H01L 51/0011* (2013.01)

(56) References Cited

U.S. PATENT DOCUMENTS

| | | |
|---|---|---|
| 2004/0188123 A1 | 9/2004 | Peterson et al. |
| 2007/0159048 A1 | 7/2007 | Chang et al. |
| 2011/0041758 A1* | 2/2011 | An .................. C23C 14/042 118/504 |
| 2015/0034005 A1* | 2/2015 | Ko .................. C23C 14/042 118/504 |
| 2016/0011504 A1 | 1/2016 | Wu |
| 2018/0355468 A1 | 12/2018 | Wang et al. |

FOREIGN PATENT DOCUMENTS

| | | |
|---|---|---|
| CN | 103668056 A | 3/2014 |
| CN | 107099770 A | 8/2017 |
| CN | 107275522 A | 10/2017 |
| CN | 107385382 A | 11/2017 |

OTHER PUBLICATIONS

CN107099770A, English Abstract and U.S. Equivalent U.S. Pub. No. 2018/0355468.
CN103668056A, English Abstract and Machine Translation.
CN103236398A, English Abstract and U.S. Equivalent U.S. Pub. No. 2016/0011504.
First Office Action for Chinese Application No. 201810004139.1, dated Jun. 11, 2019, 6 Pages.
Second Office Action for Chinese Application No. 201810004139.1, dated Nov. 21, 2019, 7 Pages.
4th Chinese Office Action, English Translation.
CN107275522A, English Abstract and Machine Translation.
CN201600550U, English Abstract and Machine Translation.
Fourth Office Action for Chinese Application No. 201810004139.1, dated Oct. 21, 2020, 7 Pages.

* cited by examiner

2-a

2-b forming a body provided with a plurality of openings using a flexible material forming cofferdams on a first surface of a body provided with a plurality of openings, wherein each cofferdam is configured to surround a corresponding opening and confine a diffusion range of a material deposited on a substrate through the opening

MASK PLATE AND PROCESS FOR MANUFACTURING THE SAME

CROSS-REFERENCE TO RELATED APPLICATION

This application claims priority to Chinese Patent Application No. 201810004139.1 filed on Jan. 3, 2018, which is incorporated herein by reference in its entirety.

TECHNICAL FIELD

The present disclosure relates to the field of display technology, in particular to a mask plate and a process for manufacturing the same.

BACKGROUND

As compared with liquid crystal displays (LCDs), organic electroluminescent displays (OLEDs) have advantages of self-illumination, high luminous efficiency, low power consumption, fast response, wide viewing angle, high brightness, bright color, thinness and lightness, etc. The OLEDs are therefore considered as the next-generation display technology and are attracting more and more attention.

In the OLED manufacturing technology, various functional layers of the OLED are generally formed based on a mask plate 100 as shown in FIG. 1, and chemical vapor deposition (CVD) is used for film deposition or evaporation. For example, thin film encapsulation layers are generally configured in such way that inorganic layers and organic layers are alternately stacked. The inorganic thin film has high water vapor blocking capability and is generally used as a water blocking layer, while a water blocking layer is usually deposited by chemical vapor deposition (CVD). For organic electronic devices, especially OLEDs, oxygen and water vapor from the surrounding environment must be strictly prevented from entering into the device and coming into contact with sensitive organic substances and electrodes. Oxygen and water vapor hardly entrances into the organic device from the thickness direction of the water blocking layer, but easily entrances from the edges of the water blocking layer and the portion where the water blocking layer and the substrate are joined. The water blocking layer in the related art could be a SiNx or SiON film layer, and chemical vapor deposition (CVD) in combination with thin film encapsulation (TFE) is used for film deposition or evaporation. As shown in 2-a and 2-b of FIG. 2, in the process of film deposition by chemical vapor deposition (CVD) based on a mask plate 100, especially a flexible mask plate, on the one hand, there is inevitably a gap between the mask plate 100 and a substrate 200, and the gap may result in a shadow region (i.e., CVD shadow), the presence of which will affect the encapsulation effect of the bezel; if the mask plate 100 is a flexible mask plate, when placing it there is a droop caused by gravity, leading to a difference in sheet deformation in the body region of each flexible mask plate and a difference in the shadow region (i.e., CVD shadow) corresponding to the body region of each flexible mask plate, so that it is more difficult to eliminate the shadow region (i.e., CVD shadow). On the other hand, in the process of aligning or moving the mask plate 100 and the substrate 200, they readily come into contact with each other. If they are in contact with each other, it is likely that the mask plate 100 will scratch the substrate 200 and thus the effects of film depositing, evaporating or packaging will be affected negatively.

SUMMARY

It is an object of the present disclosure to provide a mask plate and a process for manufacturing the same.

To achieve the above object, the present disclosure adopts the following technical solutions.

The present disclosure provides a mask plate, comprising a body provided with a plurality of openings, in which a first surface of the body is provided with cofferdams each surrounding a corresponding opening, and the structure of each cofferdam is configured to confine the diffusion range of a material deposited on a substrate through the opening.

In one example of the mask plate of the present disclosure, an inner wall of each cofferdam is flush with an inner wall of the corresponding opening, and the cofferdam confines the diffusion range of the material deposited on the substrate through the opening to be within the projection region of the opening.

In one example of the mask plate of the present disclosure, the cofferdams are made of a high-temperature resistant and flexible material.

In one example of the mask plate of the present disclosure, the high-temperature resistant and flexible material is polyimide (PI) or polystyrene (PS).

In one example of the mask plate of the present disclosure, the height of each cofferdam is greater than 0 mm and less than or equal to 0.1 mm, and the thickness of a sidewall of each cofferdam is greater than 1 mm and less than or equal to 3 mm.

In one example of the mask plate of the present disclosure, the mask plate is a flexible mask plate.

In one example of the mask plate of the present disclosure, the body is made of a flexible material.

The present disclosure also provides a method of manufacturing a mask plate, comprising forming cofferdams on a first surface of a body provided with a plurality of openings, in which each cofferdam surrounds a corresponding opening and confine the diffusion range of a material deposited on a substrate through the opening.

In one example of the method for manufacturing a mask plate of the present disclosure, forming the cofferdams comprises forming an inner wall of each cofferdam to be flush with an inner wall of the corresponding opening.

In one example of the method for manufacturing a mask plate of the present disclosure, the method further comprises, prior to forming the cofferdams on the first surface of the body provided with the plurality of openings, forming the body provided with the plurality of openings by a flexible material.

In one example of the method for manufacturing a mask plate of the present disclosure, forming the cofferdams comprises forming the cofferdams using a high-temperature resistant and flexible material.

In one example of the method for manufacturing a mask plate of the present disclosure, the height of each cofferdam is greater than 0 mm and less than or equal to 0.1 mm, and the thickness of a sidewall of each cofferdam is greater than 1 mm and less than or equal to 3 mm.

In one example of the method for manufacturing a mask plate of the present disclosure, an implementation of forming the cofferdams comprises:

forming a polyimide layer on the first surface of the body provided with the plurality of openings; and laser cutting or etching the polyimide layer, so as to form the cofferdams by a remaining portion of the polyimide layer.

In one example of the method for manufacturing a mask plate of the present disclosure, forming the polyimide layer on the first surface of the body provided with the plurality of openings comprises forming the polyimide layer on the first surface of the body provided with the plurality of openings through coating or ink jet.

In one example of the method for manufacturing a mask plate of the present disclosure, another implementation of forming the cofferdams comprises:

forming a polystyrene layer on the first surface of the body provided with the plurality of openings;
patterning the polystyrene layer to form a plurality of columnar structures spaced apart from each other; and
laser cutting or etching a part of the columnar structures, so as to form the cofferdams by a remaining part of the columnar structures.

In one example of the method for manufacturing a mask plate of the present disclosure, patterning the polystyrene layer to form the plurality of columnar structures spaced apart from each other comprises patterning the polystyrene layer to form the plurality of columnar structures spaced apart from each other through developing, exposing, or etching.

In one example of the method for manufacturing a mask plate of the present disclosure, the width of each columnar structure is greater than 0 mm and less than or equal to 0.1 mm, and an interval between two adjacent columnar structures is greater than 0 mm and less than or equal to 0.1 mm.

BRIEF DESCRIPTION OF THE DRAWINGS

The present disclosure will be further described below in detail in combination with the drawings.

DETAILED DESCRIPTION

Figure 1:
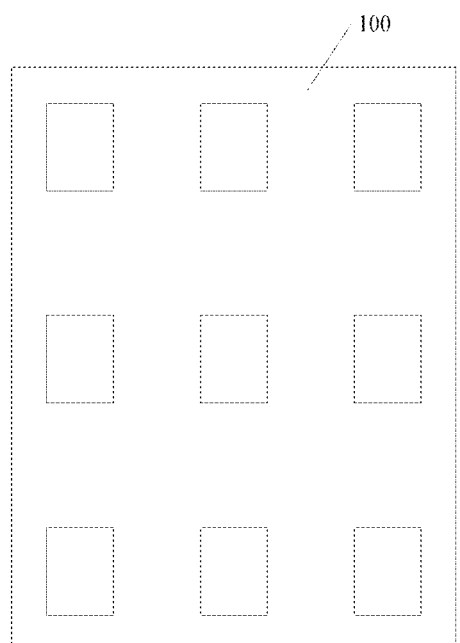
FIG. 1 shows a bottom view of a mask plate in the related art.
Figure 2:
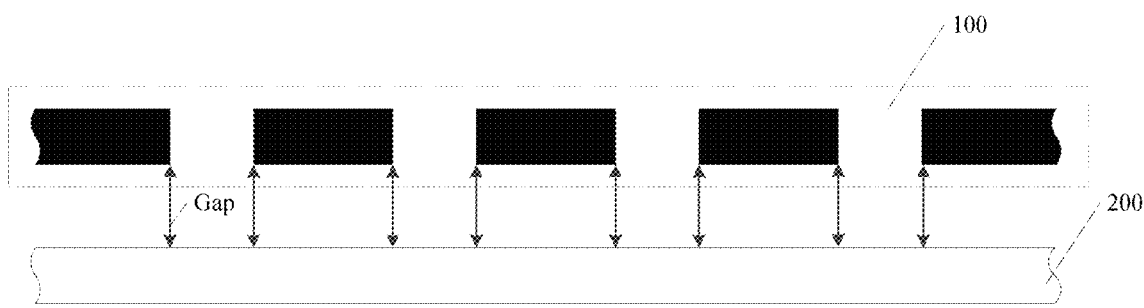
FIG. 2 includes two sectional views, 2-a and 2-b, showing the spatial relationship between the mask plate and the substrate in the process of film deposition or evaporation by chemical vapor deposition (CVD) in the related art, and the shadow region of the mask plate, respectively.
Figure 2:
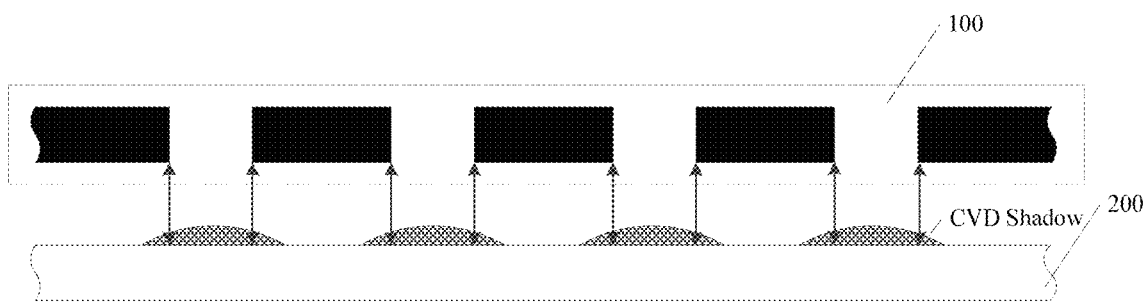

In order to illustrate the present disclosure more clearly, the present disclosure will be further described below in combination with the preferred embodiments and the drawings. Similar parts in the drawings are denoted by identical reference signs. It should be understood by those skilled in the art that the following detailed description is illustrative rather than restrictive, and should not limit the protection scope of the present disclosure.

Figure 3:
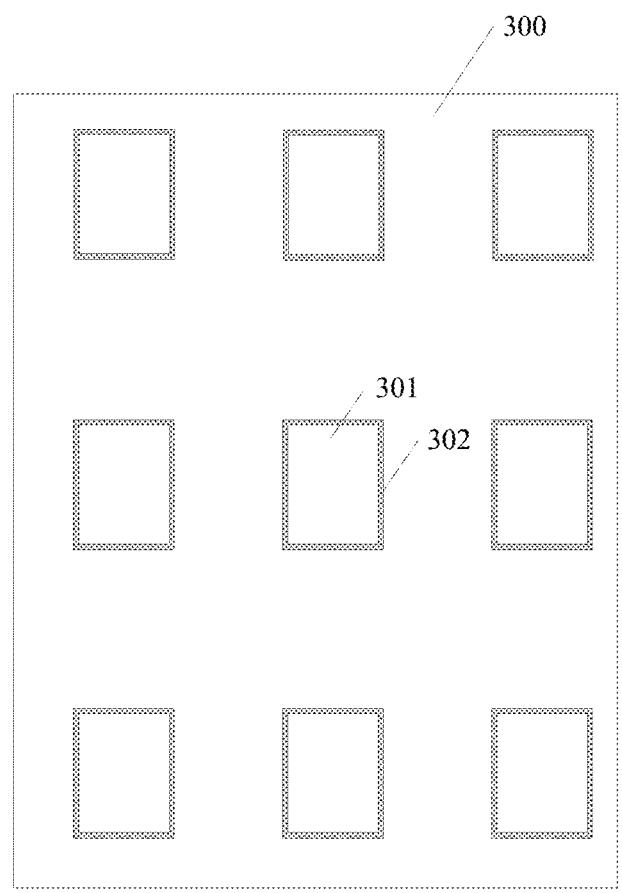
FIG. 3 shows a bottom view of a mask plate according to one embodiment of the present disclosure.
Figure 4:
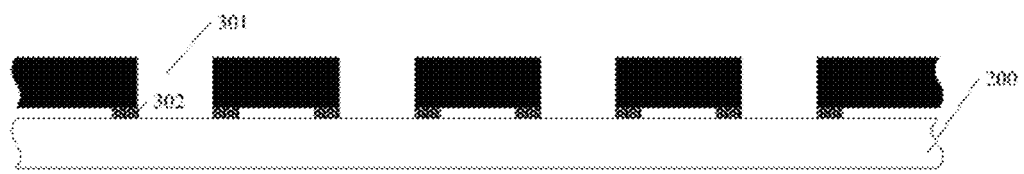
FIG. 4 shows a sectional view of a mask plate according to one embodiment of the present disclosure.

As shown in FIG. 3 and FIG. 4, one embodiment of the present disclosure provides a mask plate, comprising a body 300 provided with a plurality of openings 301, in which a surface of the body 300 is provided with cofferdams 302 each surrounding a corresponding opening 301, and the structure of each cofferdam 302 is configured to confine the diffusion range of a material deposited on a substrate 200 through the opening 301.

In the mask plate provided by this embodiment, by providing cofferdams 302 on the surface of the body of the mask plate 300 close to the substrate 200 in which each cofferdam 302 (or to say each dam structure) surrounds a corresponding opening 301 and confines the diffusion range of the material deposited on the substrate 200 through the opening 301, the cofferdam 302 can effectively prevent the film deposition material (for example, plasma, etc.) from depositing into an invalid region in the process of film deposition or evaporation by CVD based on the mask plate, thus the shadow region can be eliminated.

Those skilled in the art would understand the followings: first, each cofferdam 302 is a continuous ring, or to say a closed ring; second, each cofferdam 302 surrounds the corresponding opening 301, that is, each opening 301 on the body 300 is surrounded by a ring cofferdam 302; third, the situation shown in FIG. 4 is that the bottom surface of each cofferdam 302 comes in contact with the top surface of the substrate 200 in the process of film deposition or evaporation by CVD, however, in actual implementations, even if there is a tiny gap between the bottom surface of the cofferdam 302 and the top surface of the substrate 200, the cofferdam 302 can still confine the diffusion range of the material deposited on the substrate 200 through the corresponding opening 301.

In this embodiment, the inner wall of each cofferdam 302 is flush with the inner wall of the corresponding opening 301, thus each cofferdam 302 will confine the diffusion range of the material deposited on the substrate 200 through the corresponding opening 301 to be within the projection region of the opening 301 (or to say the projection region of the opening 301 on the substrate 200). In this way, it is possible to more effectively prevent the film deposition material from depositing into an invalid region, and maximize the elimination of the shadow region.

Those skilled in the art can understand that the inner wall of each cofferdam 302 is flush with the inner wall of the corresponding opening 301, that is, the cofferdam 302 does not shelter the opening 301 surrounded thereby, the projection region of the center hole of the cofferdam 302 on the substrate 200 is exactly same as the projection region of the opening 301 on the substrate 200 surrounded thereby. In addition, the cofferdam 302 neither shelters the corresponding opening 301 surrounded thereby, nor shelters other openings 301.

In this embodiment, the cofferdams 302 are made of a high-temperature resistant and flexible material. In this way, the cofferdams 302 can be elastically stretched, thereby preventing the body 300 of the mask plate from scratching the substrate 200 in the process of film deposition or evaporation by CVD.

In this embodiment, the high-temperature resistant and flexible material is polyimide (PI) or polystyrene (PS), that is, the cofferdams 302 are made of polyimide (PI) or polystyrene (PS).

In this embodiment, the height of each cofferdam 302 is greater than 0 mm and less than or equal to 0.1 mm, and the thickness of a sidewall of each cofferdam 302 is greater than 1 mm and less than or equal to 3 mm. The height of each cofferdam 302 refers to a height in a direction perpendicular to the body 300, of each cofferdam 302. The thickness of the sidewall of each cofferdam 302 refers to a thickness of the sidewall in a direction parallel to the body 300, of each cofferdam 302. Such size of the cofferdam 302 is designed to meet the requirements of the spatial relationship between the mask plate and the substrate 200 in the process of film deposition or evaporation by CVD while meeting the requirements of stability.

In the present embodiment, the body of the mask plate is made of a flexible material. In this embodiment, the mask plate is a flexible mask plate, and its effect is better highlighted by providing cofferdams 302 on the surface of the body 300 of the flexible mask plate close to the substrate 200 in which each cofferdam 302 surrounds the corresponding opening 301 and confines the diffusion range of the material deposited on the substrate 200 through the opening 301, that is, the flexible mask plate needs to adopt the structure of the mask plate provided by this embodiment more.

Another embodiment of the present disclosure provides a method for manufacturing a mask plate, comprising forming a cofferdam 302 on a first surface of a body 300 provided with a plurality of openings 301, in which each cofferdam 302 surrounds a corresponding opening 301 and confines the diffusion range of a material deposited on a substrate 200 through the opening 301.

By the mask plate manufactured by the method for manufacturing a mask plate of this embodiment, the cofferdams 302 can effectively prevent the film deposition material from depositing into an invalid region and the shadow region can be eliminated in the process of film deposition or evaporation by CVD.

In this embodiment, forming the cofferdams 302 comprises forming an inner wall of each cofferdam 302 to be flush with an inner wall of the corresponding opening 301. In this way, the obtained cofferdam 302 confines the diffusion range of the material deposited on the substrate 200 through the opening 301 to be within the projection region of the opening 301, and it is possible to more effectively prevent the film deposition material from depositing into an invalid region, and maximize the elimination of the shadow region.

Figure 5:
FIG. 5 shows a flow chart of the method for manufacturing a mask plate according to one embodiment of the present disclosure.

As shown in FIG. 5, the method further comprises, prior to forming the cofferdams 302 on the first surface of the body 300 provided with the plurality of openings 301, forming the body 300 provided with the plurality of openings 301 using a flexible material.

In this embodiment, the cofferdams 302 are made of a high-temperature resistant and flexible material. In this way, the cofferdams 302 can be elastically stretched, thereby preventing the body 300 of the mask plate from scratching the substrate 200 in the process of film deposition or evaporation by CVD.

Figure 6:
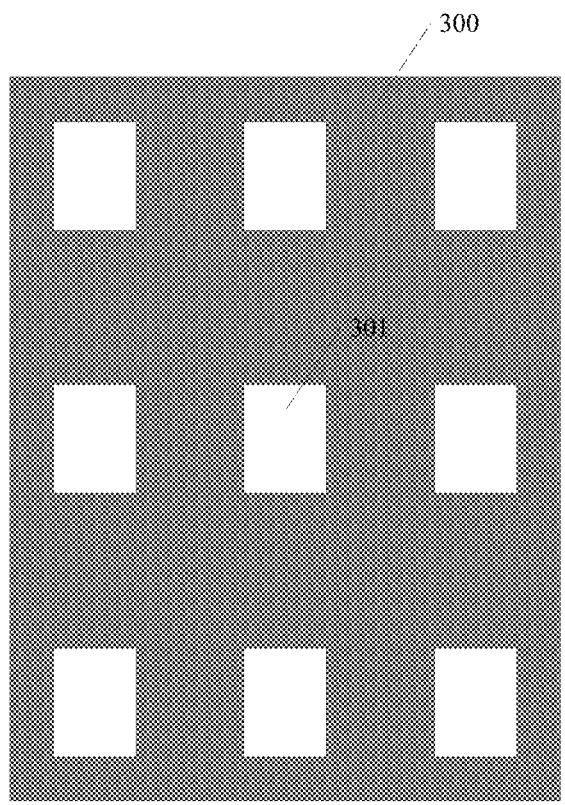
FIG. 6 shows a bottom view of a mask plate after forming a polyimide layer in the method for manufacturing a mask plate according one embodiment of the present disclosure.
Figure 7:
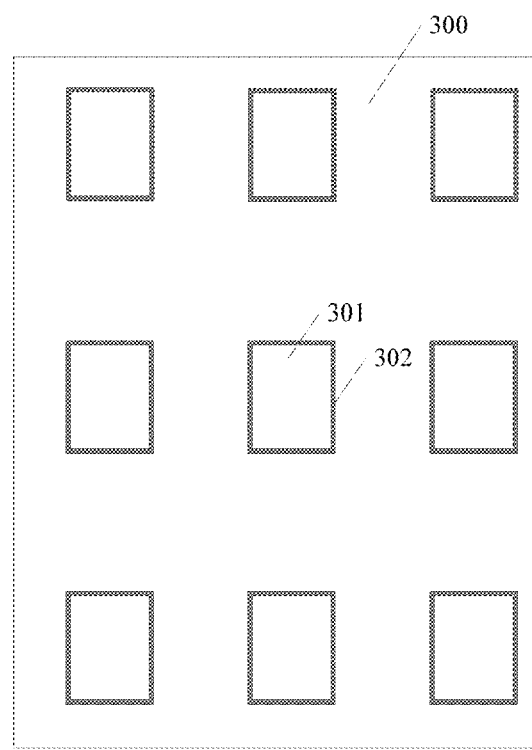
FIG. 7 shows a bottom view of a mask plate after laser cutting or etching a polyimide layer to form cofferdams in the method for manufacturing a mask plate according to one embodiment of the present disclosure.

In this embodiment, an implementation of forming the cofferdams 302 is:

forming a polyimide layer on the first surface of the body 300 provided with the plurality of openings 301, as shown in FIG. 6; and laser cutting or etching the polyimide layer, so as to form the cofferdams 302 by the remaining portion of the polyimide layer, as shown in FIG. 7.

Forming the polyimide layer on the first surface of the body 300 provided with the plurality of openings 301 can comprise forming the polyimide layer on the first surface of the body 300 provided with the plurality of openings 301 through coating or ink jet.

The thickness of the polyimide layer is greater than 0 mm and less than or equal to 0.1 mm, that is, the height of each cofferdam 302 is greater than 0 mm and less than or equal to 0.1 mm, and the thickness of a sidewall of each cofferdam 302 is greater than 1 mm and less than or equal to 3 mm. Such size of the cofferdam 302 is designed to meet the requirements of the spatial relationship between the mask plate and the substrate 200 in the process of film deposition or evaporation by CVD while meeting the requirements of stability.

Figure 8:
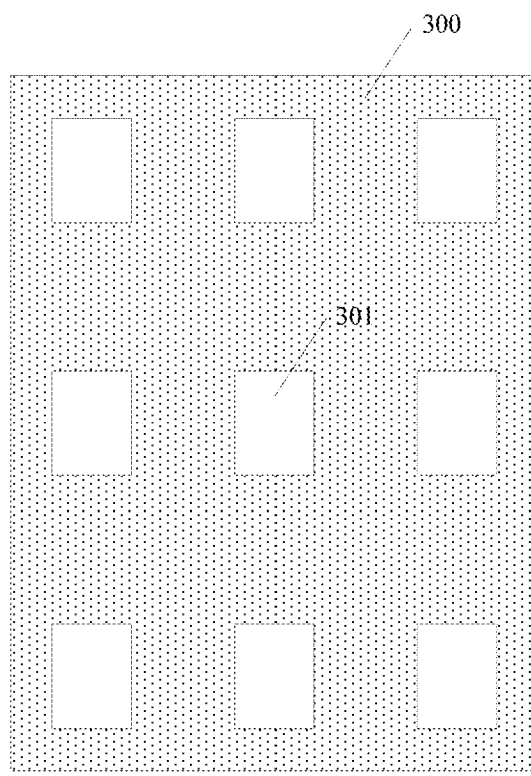
FIG. 8 shows a bottom view of a mask plate after patterning a polystyrene layer to form a plurality of columnar structures spaced apart from each other in the method for manufacturing a mask plate according to one embodiment of the present disclosure.
Figure 9:
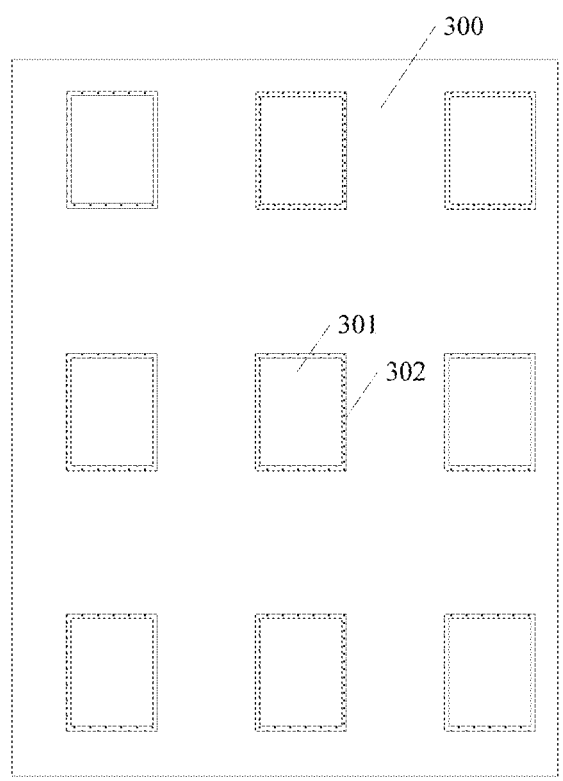
FIG. 9 is a bottom view of a mask plate after laser cutting or etching a part of the columnar structures to form cofferdams in the method for manufacturing a mask according to one embodiment of the present disclosure.

Another implementation of forming the cofferdams 302 is:

forming a polystyrene layer on the first surface of the body 300 provided with the plurality of openings 301;

patterning the polystyrene layer to form a plurality of columnar structures spaced apart from each other, as shown in FIG. 8; and laser cutting or etching a part of the columnar structures, so as to form the cofferdams 302 by a remaining part of the columnar structures, as shown in FIG. 9.

Patterning the polystyrene layer to form the plurality of columnar structures spaced apart from each other comprises patterning the polystyrene layer to form the plurality of columnar structures spaced apart from each other through developing, exposing and etching. The shape of each columnar structure can be any shape, such as a cylinder or a prism.

The height of each columnar structure is greater than 0 mm and less than or equal to 0.1 mm, that is, the height of each cofferdam 302 is greater than 0 mm and less than or equal to 0.1 mm; the width of each columnar structure is greater than 0 mm and less than or equal to 0.1 mm, and an interval between two adjacent columnar structures is greater than 0 mm and less than or equal to 0.1 mm; and the thickness of a sidewall of each cofferdam 302 is greater than 1 mm and less than or equal to 3 mm. Such size design of the columnar structure can meet the design requirement that the cofferdam 302 confines the diffusion range of the material deposited on the substrate 200 through the corresponding opening 301. Such size of the cofferdam 302 is designed to meet the requirements of the spatial relationship between the mask plate and the substrate 200 in the process of film deposition or evaporation by CVD while meeting the requirements of stability.

The performance of the cofferdams 302 formed by the former implementation mentioned above is better in confining the diffusion range of the material deposited on the substrate 200 through the openings 301, and the performance of the cofferdams 302 formed by the latter implementation is better in preventing the body 300 of the mask plate from scratching the substrate 200 in the process of film deposition or evaporation by CVD.

In the description of the present disclosure, it should be noted that the terms "up", "down", etc. indicating the orientation or spatial relationship is based on the orientation or spatial relationship shown in the drawings, and are merely for the convenience of describing the present disclosure and the simplification of the description, rather than indicating or implying that the referred equipment or element must have a particular orientation, or be constructed and operated in a particular orientation. Thus, it should not be construed as a limitation on the present disclosure. Unless expressly stated or limited otherwise, the terms "mount", "connect" or "join" shall be interpreted broadly, and may be, for example, a fixed connection, a removable connection, or an integral connection; may be a mechanical connection, or may also be an electrical connection; may be a direct connection, or may be an indirect connection through an intermediary medium, and may be an internal communication of two components. Those skilled in the art would understand the specific meanings of the above terms in the present disclosure according to specific circumstances.

It should also be noted that in the description of the present disclosure, relational terms such as first and second, etc. are only used to distinguish one entity or operation from another entity or operation, and do not necessarily require or imply that there is an actual relationship or order between the entities or operations. Moreover, the terms "comprise", "include" or any other variation thereof is intended to cover a non-exclusive inclusion, such that a process, a method, an article, or an equipment comprising a series of elements may comprise not only those elements, but also those not explicitly listed, or may further comprise the elements inherent to the process, the method, the article, or the equipment. In the case of no more limitation, the element defined by the sentence "comprise/comprising a/an . . . " does not exclude that other same elements are included in the process, the method, the article, or the equipment.

Obviously, the above embodiments of the present disclosure are merely examples for clearly illustrating the present disclosure, and are not intended to limit the implementation of the present disclosure. Those skilled in the art can make other variations or changes in various forms based on the above description. It is impossible to exhaust all the implementations, and any obvious variation or change derived from the technical solutions of the present disclosure should fall into the protection scope of the present disclosure.

What is claimed is:

1. A mask plate, comprising a body provided with a plurality of openings, wherein a first surface of the body is provided with cofferdams each surrounding a corresponding opening of the plurality of openings, and each of the
    cofferdams is configured to confine a diffusion range of a material deposited on a substrate through the corresponding openings;
    the cofferdams are made of polyimide or polystyrene;
    a height of each of the cofferdams is greater than 0 mm and less than or equal to 0.1 mm, and a thickness of a sidewall of each of the cofferdams is greater than 1 mm and less than or equal to 3 mm;
    each of the plurality of openings is surrounded by one of the cofferdams; and
    a gap between a bottom surface of each of the cofferdams and a top surface of the substrate; and
    an enclosed gap between any two adjacent cofferdams between the bottom surface of the body and the top surface of the substrate.

2. The mask plate according to claim 1, wherein an inner wall of each of the cofferdams is flush with an inner wall of the corresponding opening.

3. The mask plate according to claim 1, wherein the cofferdams are made of a flexible material.

4. The mask plate according to claim 2, wherein the cofferdams are made of a flexible material.

5. The mask plate according to claim 1, wherein the mask plate is a flexible mask plate.

6. The mask plate according to claim 1, wherein the body is made of a flexible material.

7. A method for manufacturing a mask plate, comprising forming cofferdams on a first surface of a body provided with a plurality of openings, wherein each cofferdam is configured to surround a corresponding opening of the plurality of openings and confine a diffusion range of a material deposited on a substrate through the opening;
    the cofferdams are made of polyimide or polystyrene;
    a height of each of the cofferdams is greater than 0 mm and less than or equal to 0.1 mm, and a thickness of a sidewall of each cofferdam is greater than 1 mm and less than or equal to 3 mm;
    each of the plurality of openings is surrounded by one of the cofferdams; and
    a gap between a bottom surface of each of the cofferdams and a top surface of the substrate; and
    an enclosed gap between any two adjacent cofferdams between the bottom surface of the body and the top surface of the substrate.

8. The method according to claim 7, wherein forming the cofferdams comprises forming an inner wall of each of the cofferdams to be flush with an inner wall of the corresponding opening.

9. The method according to claim 7, further comprising, prior to forming the cofferdams on the first surface of the body provided with the plurality of openings, forming the body provided with the plurality of openings using a flexible material.

10. The method according to claim 7, wherein forming the cofferdams comprises forming the cofferdams using a flexible material.

11. The method according to claim 7, wherein forming the cofferdams comprises:
    forming a polyimide layer on the first surface of the body provided with the plurality of openings; and
    laser cutting or etching the polyimide layer, so as to form the cofferdams by a remaining portion of the polyimide layer.

12. The method according to claim 11, wherein forming the polyimide layer on the first surface of the body provided with the plurality of openings comprises forming the polyimide layer on the first surface of the body provided with the plurality of openings through coating or ink jet.

13. The method according to claim 7, wherein forming the cofferdams comprises:
    forming a polystyrene layer on the first surface of the body provided with the plurality of openings;
    patterning the polystyrene layer to form a plurality of columnar structures spaced apart from each other; and
    laser cutting or etching a part of the columnar structures, so as to form the cofferdams by a remaining part of the columnar structures.

14. The method according to claim 13, wherein patterning the polystyrene layer to form the plurality of columnar structures spaced apart from each other comprises patterning the polystyrene layer to form the plurality of columnar structures spaced apart from each other through developing, exposing, or etching.

15. The method according to claim 13, wherein a width of each columnar structure is greater than 0 mm and less than or equal to 0.1 mm, and an interval between two adjacent columnar structures is greater than 0 mm and less than or equal to 0.1 mm.

16. The mask plate according to claim 1, wherein the cofferdams are made of a different material than the body.

17. The method according to claim 7, wherein the cofferdams are made of a different material than the body.

18. The mask plate according to claim 1, wherein each of the cofferdams is a continuous ring.

* * * * *